US009735588B2

(12) United States Patent
Gilbert et al.

(10) Patent No.: US 9,735,588 B2
(45) Date of Patent: Aug. 15, 2017

(54) POWER SOURCE SYSTEM WITH MULTIPLE ELECTRICAL OUTPUTS

(71) Applicant: Fluke Corporation, Everett, WA (US)

(72) Inventors: John M. Gilbert, Seattle, WA (US); David L. Epperson, Everett, WA (US); Paul A. Ringsrud, Langley, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 15/209,674

(22) Filed: Jul. 13, 2016

(65) Prior Publication Data
US 2016/0322831 A1    Nov. 3, 2016

Related U.S. Application Data

(63) Continuation-in-part of application No. 14/595,576, filed on Jan. 13, 2015.

(51) Int. Cl.
*H02J 5/00* (2016.01)
*H02M 7/04* (2006.01)
(Continued)

(52) U.S. Cl.
CPC .............. *H02J 5/005* (2013.01); *G01D 11/00* (2013.01); *G01R 1/22* (2013.01); *G01R 15/14* (2013.01); *G01R 15/186* (2013.01); *G01R 19/2513* (2013.01); *H02J 1/08* (2013.01); *H02M 7/04* (2013.01)

(58) Field of Classification Search
CPC ...... G01D 11/00; G01R 15/14; G01R 15/186; G01R 19/2513; H02J 5/005; H02J 1/08; H02M 7/04
See application file for complete search history.

(56) References Cited

U.S. PATENT DOCUMENTS

| 7,750,621 | B1 * | 7/2010 | Liu ..................... G01R 1/06788 324/126 |
| 2006/0202664 | A1 * | 9/2006 | Lindsey .................. H02J 5/005 320/137 |

(Continued)

FOREIGN PATENT DOCUMENTS

CA    2 874 908 A1    12/2013

OTHER PUBLICATIONS

Extended European Search Report, dated Jun. 17, 2016, for European Application No. 16151112.6-1568, 7 pages.
Fluke, "1730 Energy Logger" Users Manual, Sep. 2013, 70 pages.

*Primary Examiner* — Francis Gray
(74) *Attorney, Agent, or Firm* — Seep IP Law Group LLP

(57) ABSTRACT

A system providing a power source includes an electrical input and multiple electrical outputs. The electrical input is couplable to a current clamp that selectively clamps around at least one electrical conductor. A transformer coupled to the electrical input receives an input electrical signal from the at least one electrical conductor and produces an output electrical signal that is electrically isolated from the input electrical signal. Conversion circuitry electrically converts the output electrical signal to a converted electrical signal that is usable to power multiple electrical devices. Distribution circuitry distributes the converted electrical signal to the multiple electrical outputs, wherein each electrical output is couplable to an electrical device to provide power to the electrical device.

19 Claims, 12 Drawing Sheets

(51) Int. Cl.
*H02J 1/08* (2006.01)
*G01D 11/00* (2006.01)
*G01R 1/22* (2006.01)
*G01R 15/14* (2006.01)
*G01R 15/18* (2006.01)
*G01R 19/25* (2006.01)

(56) References Cited

U.S. PATENT DOCUMENTS

| | | |
|---|---|---|
| 2007/0007968 A1 | 1/2007 | Mauney, Jr. et al. |
| 2009/0015239 A1 | 1/2009 | Georgiou et al. |
| 2010/0085036 A1 | 4/2010 | Banting et al. |
| 2010/0231198 A1 | 9/2010 | Bose et al. |
| 2010/0253318 A1 | 10/2010 | Thomas, Sr. |
| 2011/0012589 A1* | 1/2011 | Greenberg ............. G01R 15/12 324/127 |
| 2011/0172938 A1 | 7/2011 | Gu et al. |
| 2012/0013292 A1 | 1/2012 | Ali et al. |
| 2012/0306434 A1* | 12/2012 | Sassen ................. H02J 7/0027 320/107 |
| 2014/0145858 A1 | 5/2014 | Miller et al. |
| 2014/0176155 A1 | 6/2014 | Davis |
| 2016/0084879 A1* | 3/2016 | Luo ..................... G01R 1/0416 324/127 |

* cited by examiner

POWER SOURCE SYSTEM WITH MULTIPLE ELECTRICAL OUTPUTS

BACKGROUND

Technical Field

The present disclosure relates to systems for providing a power source for multiple electrical devices, such as testing devices, in an electrical equipment area.

Description of the Related Art

Various testing devices are used to measure parameters of electrical equipment areas. For example, sensors can detect electrical characteristics of the electrical equipment, such as voltage, current, resistance, and the like. Sensors can also detect environmental characteristics of the electrical equipment area or the surrounding area, such as temperature, pressure, humidity, and the like. Data obtained from the testing devices can be used to evaluate performance of the electrical equipment, potential dangers to the electrical equipment, needed adjustments or maintenance of the electrical equipment, and the like.

Some electrical equipment areas can be difficult to access. For example, electrical equipment areas can be enclosed and accessible only via one or more panels. Such panels can be large, sometimes requiring more than one person to open, and opening such panels can take a significant amount of time and energy. Electrical equipment areas can also be dangerous, such as in the case of electrical equipment areas that contain high energy circuits. Persons entering such areas may need to use personal protective equipment that has high electric resistivity for protection from electric shock. Such personal protective equipment can include special clothing, gloves, footwear, headwear, and the like. However, the use of personal protective equipment can be slow and cumbersome, adding to the time and cost of entering electrical equipment areas. Safety concerns may also necessitate shutting down some or all of the electrical equipment when people enter electrical equipment areas, resulting in loss of service by the electrical equipment while people are accessing the area.

Because entering electrical equipment areas can incur time, labor, and operational costs, and risk of personal safety, reducing the number of times that entry into electrical equipment areas is desirable. In addition, ongoing monitoring by testing devices may also be desirable, especially in the case of continuously operating electrical equipment.

BRIEF SUMMARY

Disclosed herein is a system that provides a power source to multiple electrical outputs for powering electrical devices, such as testing devices, in an electrical equipment area. In at least one embodiment, the system includes a current clamp that forms a current transformer. The current clamp is configured to be clamped around an electrical conductor and output an induced current when a varying current is flowing through the electrical conductor. The system further includes a power distribution unit that is electrically coupled to the current clamp. The power distribution unit includes multiple electrical outputs, conversion circuitry, and distribution circuitry. The conversion circuitry receives the induced current from the current clamp and electrically converts the induced current to a converted current that is usable to power multiple electrical devices. The distribution circuitry distributes the converted current to the multiple electrical outputs, wherein each electrical output is couplable to an electrical device to provide power to the electrical device.

The induced current may be an alternating current and the conversion circuitry electrically converts the induced current to a direct current. The current clamp may output the induced current at a first voltage and the conversion circuitry electrically converts the induced current to a converted current having a second voltage that is different (e.g., higher or lower) than the first voltage.

In some embodiments, the distribution circuitry distributes the converted current equally to the multiple electrical outputs. In other embodiments, the distribution circuitry selectively distributes different amounts of the converted current to different electrical outputs of the multiple electrical outputs.

The distribution circuitry may include one or more gating elements that control an amount of converted current that flows to one or more of the multiple electrical outputs. The distribution circuitry may further include a sensor operable to sense an amount of current flowing to the multiple electrical outputs. The one or more gating elements may control the amount of converted current that flows to the one or more electrical outputs based on the sensed amount of current.

In some embodiments, the one or more gating elements selectively control the amount of converted current that flows to an electrical output based on a priority assigned to the electrical output and/or a location of the electrical output relative to other electrical outputs. In some embodiments, the one or more gating elements selectively control the amount of converted current that flows to different electrical outputs during different time periods.

In another embodiment, disclosed herein is a system that provides a power source, wherein the system includes an electrical input and multiple electrical outputs. The electrical input is couplable to a current clamp that selectively clamps around at least one electrical conductor. A transformer coupled to the electrical input produces an output electrical signal that is electrically isolated from current flowing in the at least one electrical conductor. The system further includes conversion circuitry that electrically converts the output electrical signal to a converted electrical signal that is usable to power multiple electrical devices. Distribution circuitry distributes the converted electrical signal to the multiple electrical outputs, wherein each electrical output is couplable to an electrical device to provide power to the electrical device.

In some embodiments, the current clamp forms the transformer and produces the output electrical signal by induction from an electrical signal flowing in the at least one electrical conductor. In some embodiments, the distribution circuitry includes a sensor that senses an amount of current flowing to the multiple electrical outputs, and the system further includes control circuitry that controls an amount of current that flows to one or more of the multiple electrical outputs based on the sensed amount of current.

In some embodiments, the system includes communication circuitry that communicates with at least one electrical device coupled to at least one electrical output of the multiple electrical outputs and receives data from the at least one electrical device. The communication circuitry may receive data from the at least one electrical device via the at least one electrical output to which the electrical device is coupled. The communication circuitry may further communicate with a remote computing device and transmit the received data to the remote computing device.

In some embodiments, the system includes communication circuitry configured to communicate with a remote computing device and receive instructions from the remote computing device. The distribution circuitry includes one or more gating elements that control an amount of current that flows to one or more of the multiple electrical outputs based on instructions received from the remote computing device.

In some embodiments, the system includes communication circuitry that is configured to communicate with a remote computing device and transmit information pertaining to operation of the system to the remote computing device.

Further disclosed herein is a system providing a power source that is positionable within an electrical equipment area. The system includes a current transformer that is selectively positionable with respect to an electrical conductor of multiple electrical conductors in the electrical equipment area such that a varying current flowing through the electrical conductor induces a current in the current transformer. The system further includes conversion circuitry electrically coupled to the current transformer, wherein the conversion circuitry electrically converts the current induced in the current transformer to a converted current that is usable to power multiple electrical devices. The system also includes distribution circuitry that distributes the converted current to multiple electrical outputs, wherein each electrical output is couplable to a separate electrical device to provide power to the respective electrical device.

In various embodiments, at least the conversion circuitry, the distribution circuitry, and the multiple electrical outputs are contained within a housing that remains in the electrical equipment area when the current transformer is positioned with respect to the electrical conductor and the converted current is being distributed to the multiple electrical outputs. The current transformer may be a current clamp that is clampable around an electrical conductor in the electrical equipment area.

DETAILED DESCRIPTION

Figure 1A:
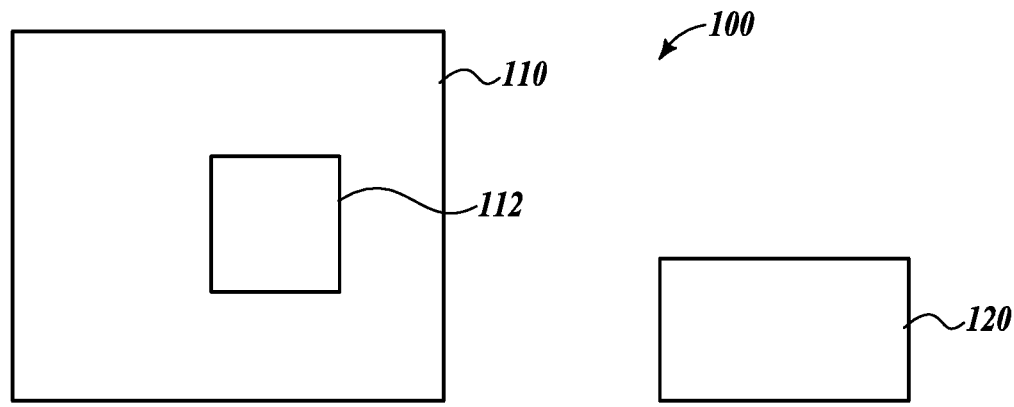
FIGS. 1A and 1B depict an example of a system with an electrical equipment area and a monitoring station.
Figure 1B:
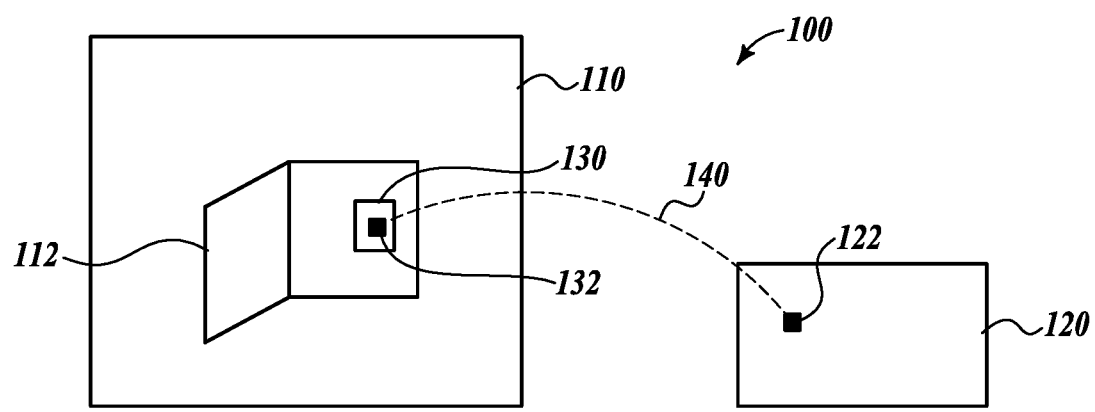

FIGS. 1A and 1B depict an example of a system 100 that includes an electrical equipment area 110 and a monitoring station 120. In some examples, the electrical equipment area 110 can be an enclosure, such as an electrical panel or a Faraday room or cage, a restricted area, such as a fenced-in electrical substation, or any other type of area that can contain or hold electrical equipment. Although not depicted in FIGS. 1A and 1B, the electrical equipment may include electrical components, such as electrical wires, transformers, capacitors, circuit breakers, switches, voltage regulators, and the like. The electrical equipment may also include non-electrical components that support electrical components, such as support structures, towers, fences, poles, conduits, and the like.

The monitoring station 120 may include a computing device, such as computer or a server, and can be used to monitor conditions within the electrical equipment area 110. The monitoring station 120 is located remotely from the electrical equipment area 110. For example, the monitoring station 120 can be located a distance away from the electrical equipment area 110 such that a person can interact with the monitoring station 120 without needing to take special precaution from risks associated with the electrical equipment area 110 (e.g., without needing to wear personal protective equipment).

The electrical equipment area 110 includes a panel 112 that can be opened or removed to gain access to an interior of the electrical equipment area 110. The panel 112 can be hinged and swing open, as is depicted in FIG. 1B, or the panel 112 can be completely removable from the electrical equipment area 110. In one example, the panel 112 may be large enough that it can be opened only by more than one person.

As shown in FIG. 1B, a testing device 130 can be placed in the electrical equipment area 110. The testing device 130 is capable of measuring a characteristic relating to electrical equipment, including the area 110 holding the electrical equipment. Characteristics that can be measured include electrical characteristics (e.g., voltages in electrical components, current in electrical components, magnetic fields generated by electrical components, and the like), environmental characteristics (e.g., temperature within the area 110, pressure within the area 110, relative humidity within the area 110, temperature of components of the electrical equipment, and the like), or any other characteristic relating to the area 110 or the electrical equipment within the area 110. The testing device 130 can receive data relating to the characteristic of the electrical equipment in the area 110 using one or more sensors. A sensor can be an external sensor that is external to and coupled to the testing device 130. A sensor can also be an internal sensor within the testing device 130.

In some embodiments, the testing device 130 is also capable of transmitting the measured data to the monitoring station 120 via a transmission 140. In one example, the testing device 130 can log the measured characteristics for a time and transmit the logged characteristics to the monitoring station 120. In another example, the testing device 130 can transmit the measured characteristics to the monitoring station 120 immediately upon receiving the measured characteristics without logging the measured characteristics internally within the testing device 130. The testing device 130 includes a transmitter 132 that sends the transmission 140 and the monitoring station 120 includes a receiver 122 that receives the transmission 140. In one example, the transmission 140 is a radio transmission, the transmitter 132 is a radio transmitter, and the receiver 122 is a radio receiver. In another example, one or both of the transmitter 132 and the receiver 122 is a transceiver. In another example, the transmission 140 can be aided by a repeater or other intermediary device. The transmission 140 can be wired, wireless, or some combination of both wired and wireless. For example, the transmitter 132 can send the transmission 140 via a Wi-Fi signal to a Wi-Fi base station and the Wi-Fi base station can pass the transmission 140 to the receiver 122 via a wired network connection. Any number of other combinations of wired and wireless transmissions may be possible.

The testing device 130 can be placed within the electrical equipment area 110 and left operating inside of the electrical equipment area 110 when the panel 112 is replaced. While inside of the electrical equipment area 110, the testing device 130 can measure a characteristic relating to the electrical equipment and transmit the measured characteristic to the monitoring station 120. However, the testing device 130 requires power to operate. Some operations of the testing device 130 may require more power than others (e.g., the testing device 130 may use less power when measuring data than when sending the transmission 140). Many testing devices are battery powered, particularly in the case of handheld testing devices. The testing device 130, if battery-powered, can operate for a limited time inside of the electrical equipment area 110 using power provided by the batteries.

One drawback to the use of batteries alone is that batteries store a finite amount of electrical power. For example, batteries alone may be able to power the testing device 130 for a few days or weeks, but the batteries need to be replaced when the batteries are depleted. Frequently needing to replace the batteries increases the number of times that the panel 112 needs to be opened. The cost and risk associated with opening the panel 112 and a person entering the electrical equipment area 110 is increased. Power sources that can power the testing device 130 continuously may not be available within the electrical equipment area 110. Power lines and electrical circuits within electrical equipment areas typically provide power that well exceeds the power requirements of the testing device 130 and the electrical equipment areas typically do not have standard power outlets (e.g., a 110-volt power outlet that is standard in the United States). Most electrical equipment areas have strict operational constraints that require electrical devices to be tested and/or meet certain standards to operate within the electrical equipment areas. Open and available power outlets may also increase the hazard of electric shock in areas holding electrical equipment and thus may not be permitted.

FIGS. 2A-2D depict examples of a system 200 in accordance with the present disclosure that provides continuous power to a testing device 220 within an electrical equipment area 210. The system 200 includes a current clamp 240 and the testing device 220. The electrical equipment area 210 includes an electrical conductor 212 that carries an electric current. Many electrical equipment areas include electrical conductors that constantly carry electric current. As explained in greater detail below, the current clamp 240 can be used to induce enough current from the electrical conductor 212 to provide power to operate the testing device 220.

The current clamp 240 forms a non-toroidal current transformer 242 that can be clamped around the electrical conductor 212. In the embodiment shown, the current clamp 240 includes a handle 244 with an activation component 246. The current transformer 242 of the current clamp 240 is biased to a closed position, but can be opened by moving the activation component 246. The non-toroidal shape of the current transformer 242 allows a user to open the current transformer 242, place the current transformer 242 around the electrical conductor 212, and allow the current transformer 242 to return to the closed position around the electrical conductor 212 without needing to disconnect the electrical conductor 212 or stop the current flowing through the electrical conductor 212. This ability to quickly and easily clamp the current transformer 242 around the electrical conductor 212 reduces the amount of time required to install the testing device 220 in the electrical equipment area 210. In addition, many existing current clamps that can be used in the electrical equipment area 210 are already rated to satisfy the safety standards required by the electrical equipment area 210. Thus, no additional rating or certification of components will be required to provide a constant source of power to the testing device 220.

The current transformer 242 induces an electric current from the current flowing through the electrical conductor 212. The electric current carried by the electrical conductor 212 can be significantly higher than the current needed to power the testing device 220. Thus, the electric current induced by the current transformer 242 can be significantly lower than the electric current carried by the electrical conductor 212. For example, in at least one embodiment, the electric current induced by the current transformer 242 is equal to or less than about 1% of the electric current carried by the electrical conductor 212. In another embodiment, the electric current induced by the current transformer 242 is equal to or less than about 0.2% of the electric current carried by the electrical conductor 212. In yet another embodiment, the electric current carried by the electrical conductor 212 is at least 10 amps. The electric current induced by the current transformer 242 can be low enough that the electric current carried by the electrical conductor 212 is not significantly affected by the current transformer 242. The jaw size of the current clamp 240 and/or the step down of the current transformer 242 can be selected based on one or more of a size of the electrical conductor 212, the space available in the electrical equipment area 210, the electric current carried by the electrical conductor 212, and/or the current needed to power the testing device 220. The number of wire turns in the current transformer 242 can be selected based on an expected current carried by the electrical conductor 212, a desired current output from the current transformer 242, a size of the current clamp 240, and/or any other consideration.

If needed, the electric current induced by the current transformer 242 can be converted to direct current by circuitry (not shown in FIGS. 2A-2D) in the system 200. For example, portions of the circuitry can be located in the handle 244, in the testing device 220, along wiring 248 coupling the current clamp 240 to the testing device 220, or any combination thereof. After the electric current induced by the current transformer 242 is converted to direct current, the direct current can be used to power the testing device 220. An example of such circuitry is described below with respect to FIG. 5.

The testing device 220 may include a display 222 and one or more user interface mechanisms 224. A user of the testing device 220 can interact with the testing device 220 by providing inputs via the one or more user interface mechanisms 224 and viewing information on the display 222. The display 222 can also be a touchscreen display that can receive user inputs directly on the display 222.

The testing device 220 may also include an indicator 226 that provides an indication whether the testing device 220 is receiving power from the current clamp 240. In the embodiment shown in FIGS. 2A-2D, the indicator 226 on the testing device 220 is a light, such as a light-emitting diode (LED), that is illuminated when the testing device 220 is receiving power from the current clamp 240. In another embodiment, the handle 244 can include an indicator, such as an LED, that indicates when current is being provided from the current clamp 240 to the testing device 220. In another embodiment, an indicator can be provided on the display, such as an icon that is displayed, when the testing device 220 is receiving power from the current clamp 240.

The testing device 220 may also be coupled to a sensor 230. In some embodiments, the sensor 230 is coupled to the testing device 220 by wiring 232. The sensor 230 can produce a signal indicative of a characteristic of electrical equipment, including one or more characteristics of the area 210 holding the electrical equipment. That signal is passed to the testing device 220 and the testing device 220 measures data about the characteristic based on the signal. The testing device 220 may also transmit the measured characteristic using a transmitter (not shown).

Figure 2A:
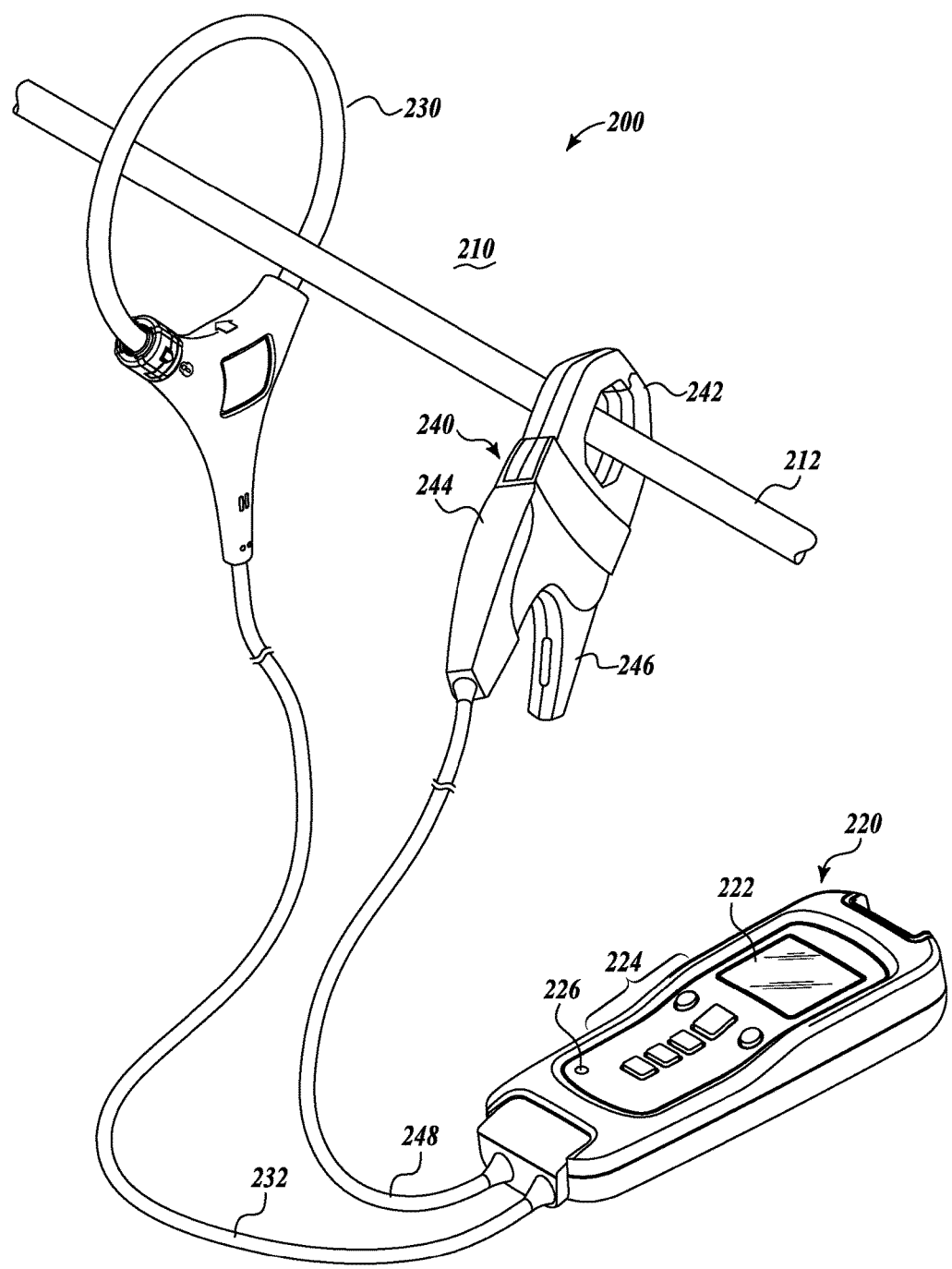
FIGS. 2A-2D depict examples of a system that provides continuous power to a testing device within an electrical equipment area.

In the embodiment depicted in FIG. 2A, the sensor 230 is external to the testing device 220. The sensor 230 is in the form of a Rogowski coil located around the electrical conductor 212. A Rogowski coil can measure electrical characteristics, such as alternating current and/or high speed current pulses in the electrical conductor 212. The sensor 230 is located around the same electrical conductor 212 from which the current clamp 240 induces a current to power the testing device 220. The electric current induced by the current transformer 242 can be low enough that the measurement by the sensor 230 is not significantly affected by the current transformer 242. For example, the amount of current induced by the current clamp 240 may be within a range of noise of the measurement by the sensor 230.

Figure 2B:
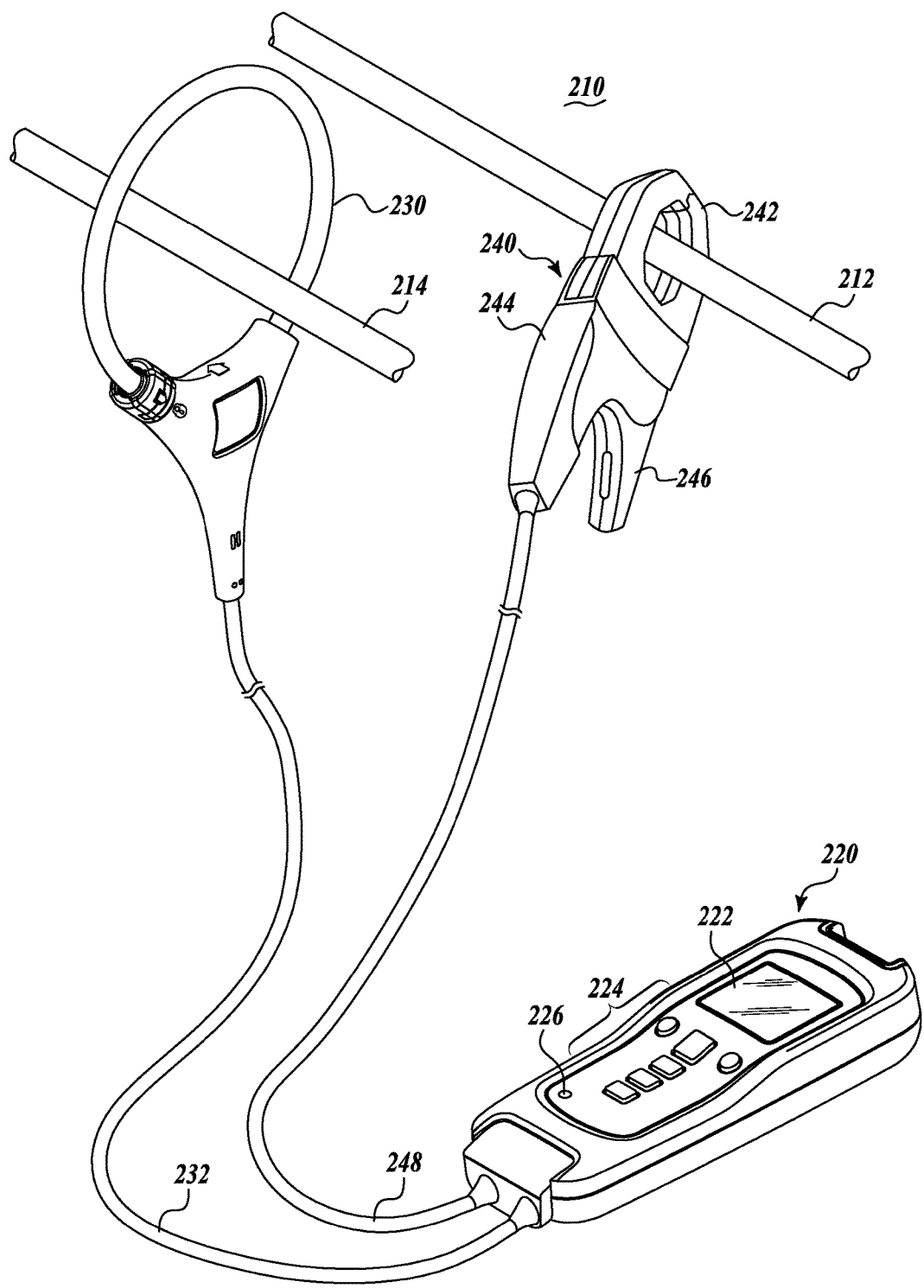

In the embodiment depicted in FIG. 2B, the electrical equipment area 210 includes the electrical conductor 212 and a second electrical conductor 214. The electrical conductor 212 and the second electrical conductor 214 may be coupled to each other or the electrical conductor 212 and the second electrical conductor 214 may be parts of different circuits within the electrical equipment area 210. The current clamp 240 is clamped around the electrical conductor 212 and induces a current from the current carried by the electrical conductor 212. The testing device 220 is powered by the current induced by the current clamp 240. In FIG. 2B, the sensor 230 is external to the testing device 220. The sensor 230 is in the form of a Rogowski coil located around the electrical conductor 214. The testing device 220 measures a characteristic relating to the electrical conductor 214 based on signals sent by the sensor 230 and transmits the measured data to a remote computing device (e.g., the monitoring station 120 shown in FIGS. 1A and 1B).

Figure 2C:
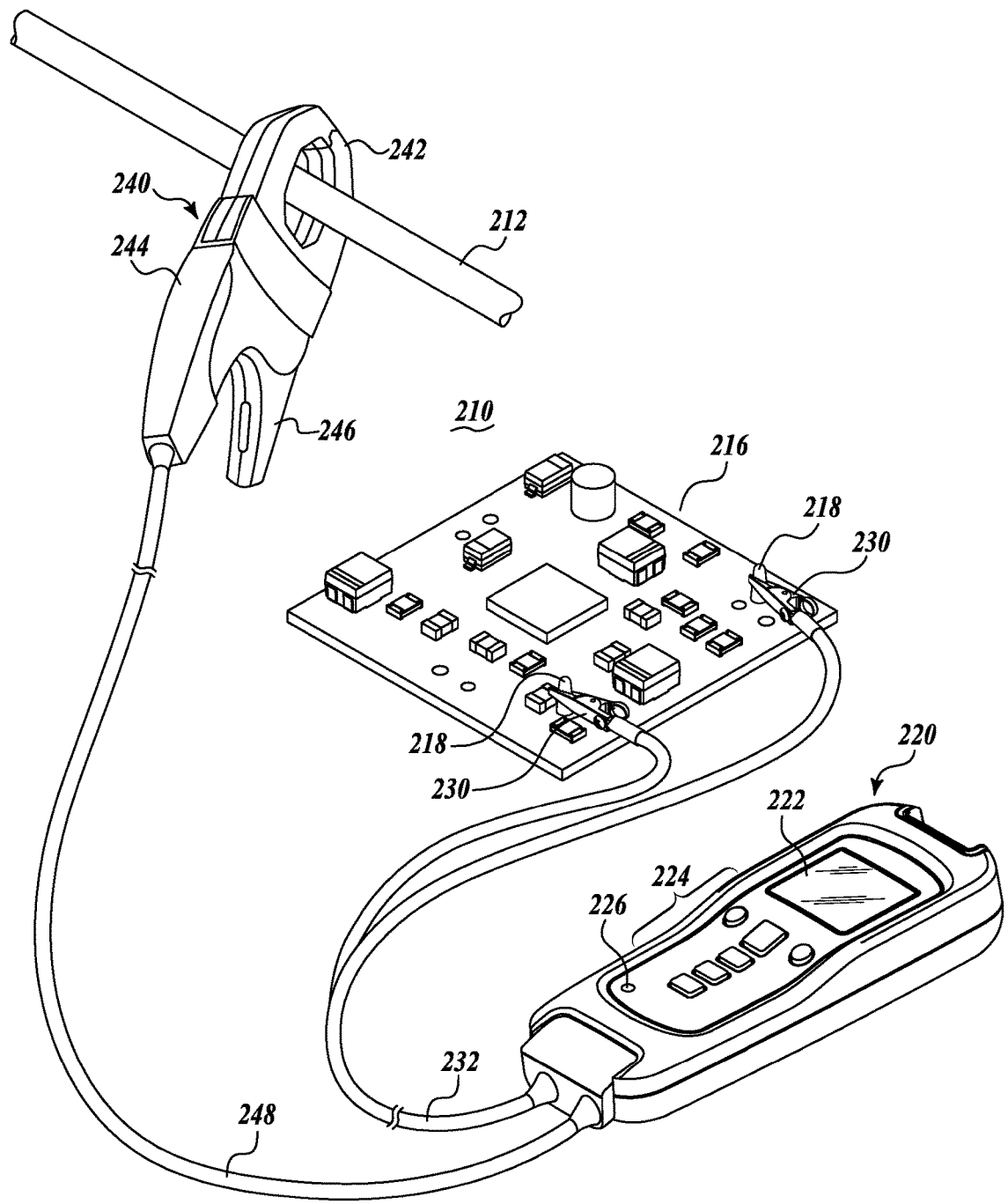

In the embodiment shown in FIG. 2C, the electrical equipment area 210 includes the electrical conductor 212 and equipment 216. The equipment 216 can be any type of equipment, such as a printed circuit board, a battery, a capacitor, a transformer, a motor, or any other type of equipment in the electrical equipment area 210. In the illustrated embodiment, the equipment 216 has leads 218. The current clamp 240 is clamped around the electrical conductor 212 and induces a current from the current carried by the electrical conductor 212. The testing device 220 is powered by the current induced by the current clamp 240. In FIG. 2C, the sensor 230 is external to the testing device 220. The sensor 230 includes connectors that connect to the leads 218 of equipment 216. The testing device 220 can measure any characteristic of the equipment 216 using the leads 218, such as a voltage difference across the leads 218, a resistance between the leads 218, and the like. The testing device 220 measures the characteristic relating to the equipment 216 and transmits the measured characteristic to a remote computing device.

Figure 2D:
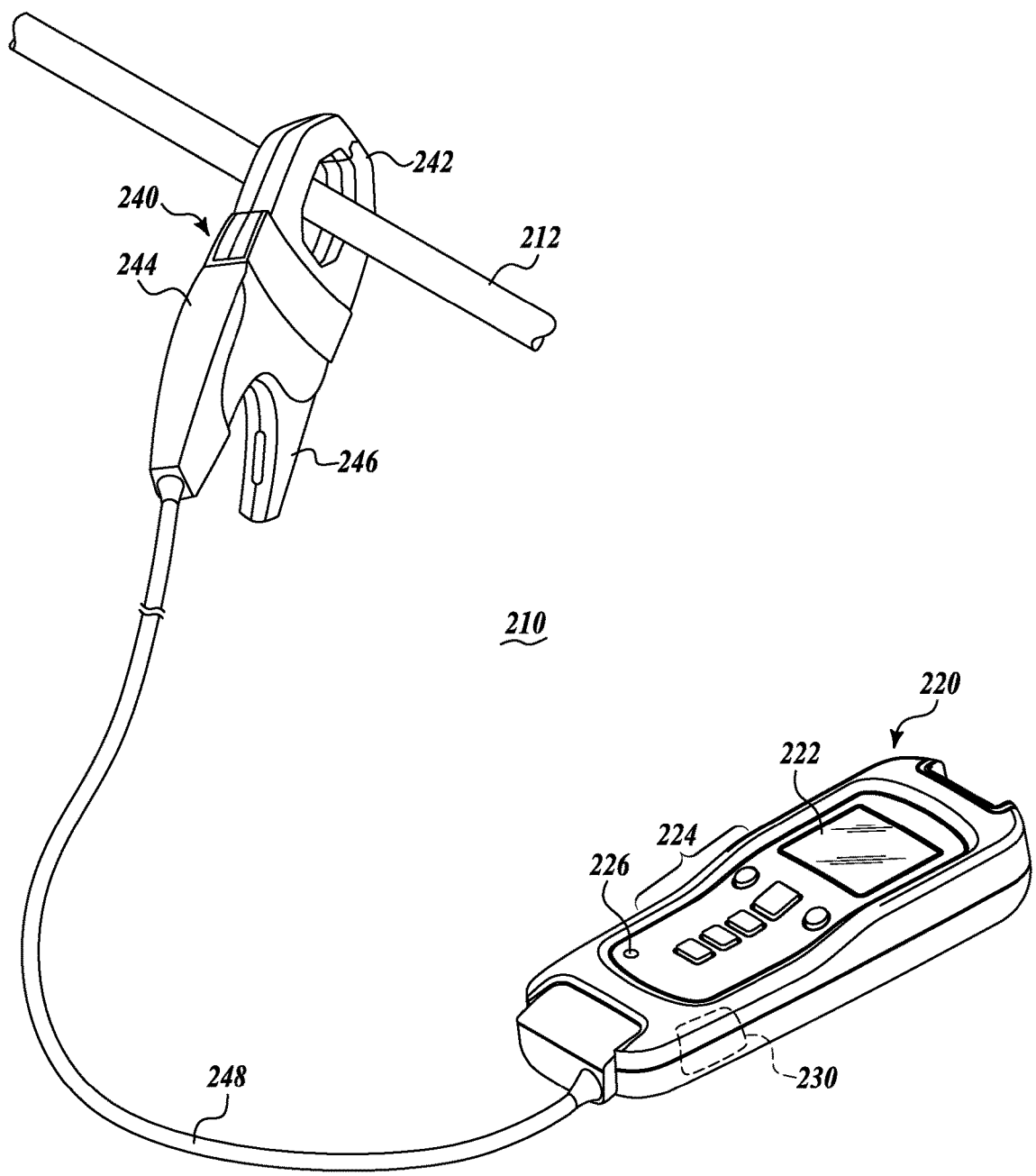

In the embodiment shown in FIG. 2D, the electrical equipment area 210 includes the electrical conductor 212. The current clamp 240 is clamped around the electrical conductor 212 and induces a current from the current carried by the electrical conductor 212. The testing device 220 is powered by the current induced by the current clamp 240. In FIG. 2D, the sensor 230 is internal to the testing device 220. The sensor 230 can be a pressure sensor (e.g., a piezoelectric sensor), a temperature sensor (e.g., a thermocouple), a humidity sensor (e.g., an electric hygrometer), or any other type of sensor. The sensor 230 sends a signal to the testing device 220 based on a characteristic within the electrical equipment area 210. The testing device 220 measures a characteristic relating to the electrical conductor 212, which may include the area 210 wherein the electrical conductor 212 is located, based on signals sent by the sensor 230 and transmits the measured data to a remote computing device.

Figure 3:
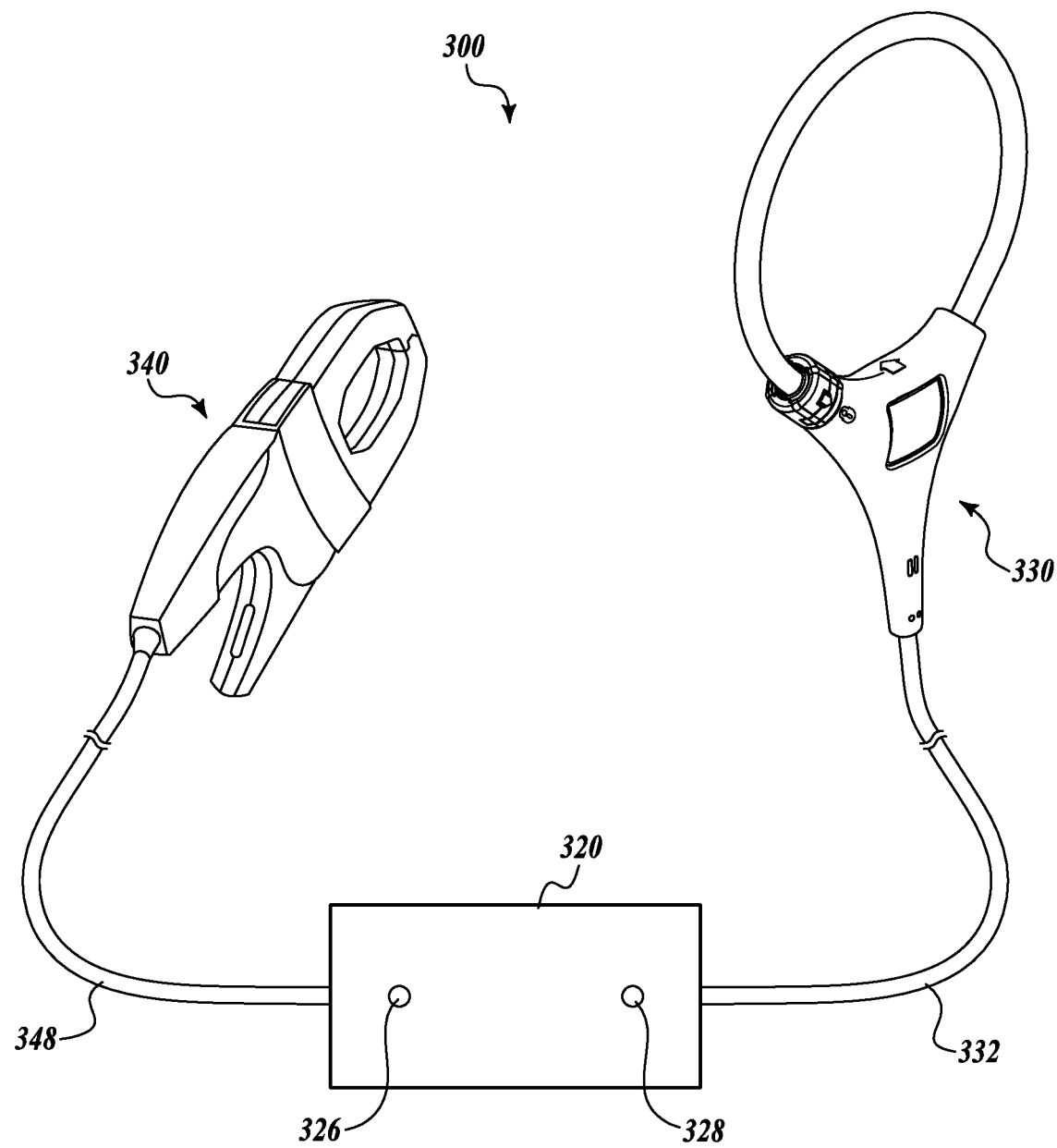
FIG. 3 depicts an embodiment of a system with a testing device that can be used in an electrical equipment area.

FIG. 3 depicts an embodiment of a system 300 with a testing device 320 that can be used in an area holding electrical equipment. The testing device 320 is coupled, via wiring 348, to a current clamp 340 that has a non-toroidal current transformer. The current clamp 340 can be placed around an electrical conductor in the area holding the electrical equipment and induce an electric current from the electrical conductor. The induced electric current can be converted to direct current and provided to the testing device 320 to power the testing device 320. The testing device 320 is also coupled to a sensor 330 via wiring 332. The testing device 320 can receive a signal from the sensor 330 indicative of a characteristic of the electrical equipment. The testing device 320 measures the characteristic of the electrical equipment based on signals sent by the sensor 330 and transmits the measured characteristic to a remote computing device.

The testing device 320 includes a first indicator 326 and a second indicator 328. In at least one embodiment, the first and second indicators 326 and 328 are lights, such as LEDs, that can be selectively illuminated. The first indicator 326 can be selectively illuminated when the testing device 320 is receiving power from the current clamp 340. The second indicator 328 can be selectively illuminated when the testing device 320 is properly measuring data and/or transmitting the measured data. The illumination of the first and second indicators 326 and 328 allow a user (e.g., someone installing the testing device 320 in the electrical equipment area) to see that the testing device 320 is properly powered and properly operating. In the embodiment shown in FIG. 3, the testing device 320 does not include a display. The cost of the testing device 320 is lower without a display, but the lack of a display may make the testing device 320 more difficult for a user to interact with the testing device 320. However, in the case where the testing device 320 is placed in an electrical equipment area and left unattended for long periods of time to measure and transmit data without user interaction, the lack of a display may not be a significant hindrance to use of the testing device 320 over most of its lifetime.

Figure 4A:
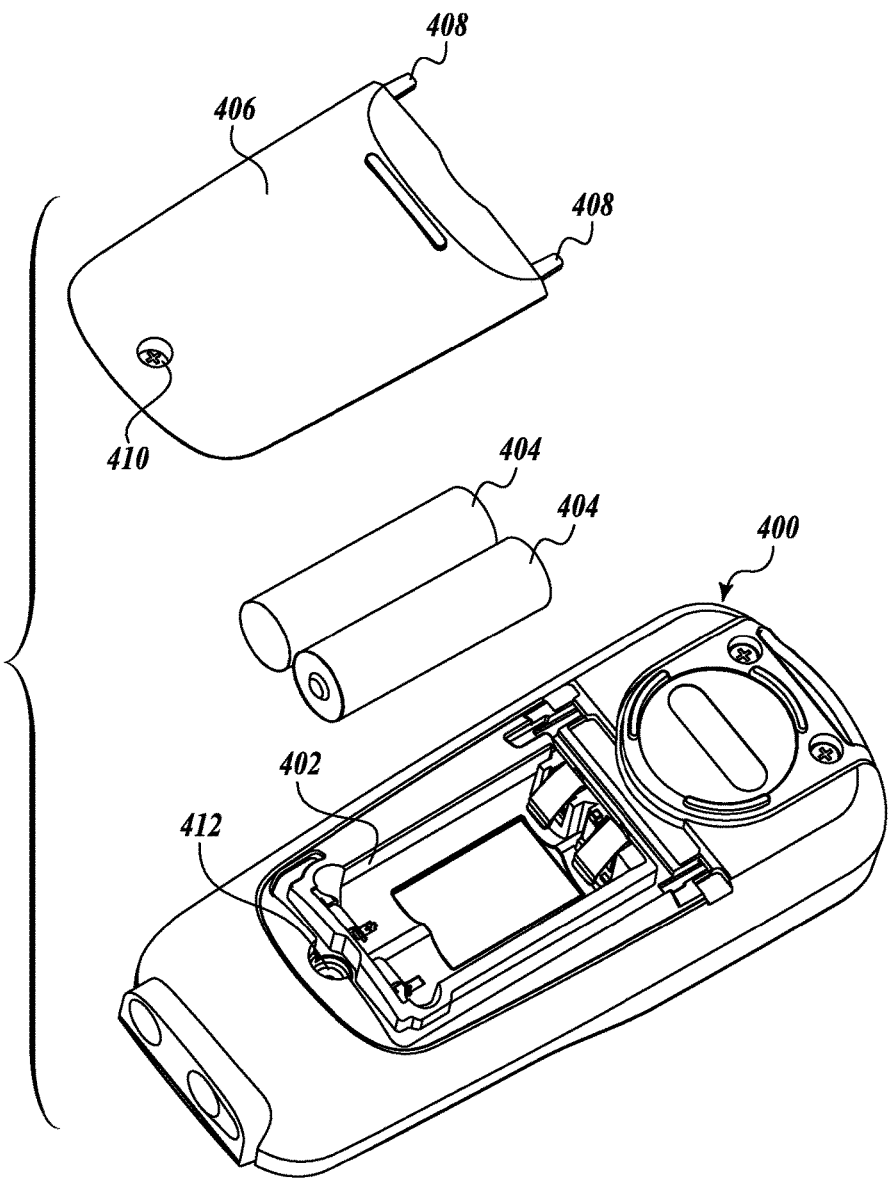
FIG. 4A depicts a rear view of an embodiment of a testing device and an associated battery compartment cover.

FIG. 4A depicts a rear view of an embodiment of a testing device 400 and an associated battery compartment cover 406. The testing device 400 includes a battery compartment 402 that accepts one or more batteries 404. The testing device 400 may have been designed as a stand-alone unit to operate on the power provided by the one or more batteries 404. The testing device 400 may have been provided with the battery compartment cover 406 that encloses the battery compartment 402 to protect the one or more batteries 404 during operation and to prevent the one or more batteries 404 from coming out of the battery compartment 402 during operation. The battery compartment cover 406 has connecting features that allow the battery compartment cover 406 to be secured to the battery compartment 402, including tabs 408 that can be inserted into slots (not shown) in battery compartment 402 and a screw 410 that can be secured into threaded hole 412. In other embodiments, the battery compartment cover 406 can have different connecting features, such as a spring clip, sliding tabs, and the like.

The testing device 400 can be operated under the power provided by the one or more batteries 404. However, as described above, using testing device 400 powered by the one or more batteries 404 alone may not be ideal in situations where the testing device 400 is left in an electrical equipment area for long periods of time. The one or more batteries 404 may store enough electrical energy to power the testing device 400 inside the electrical equipment area for only a few days or weeks. Once the one or more batteries 404 are depleted, a person would need to enter the electrical equipment area to replace the one or more batteries 404, potentially causing risk to the person entering the electrical equipment area, interruption of service of the electrical equipment area when the person is in the electrical equipment area, loss of labor of the person entering the electrical equipment area and anyone else that may need to assist in gaining access to the electrical equipment area, and the like.

Figure 4B:
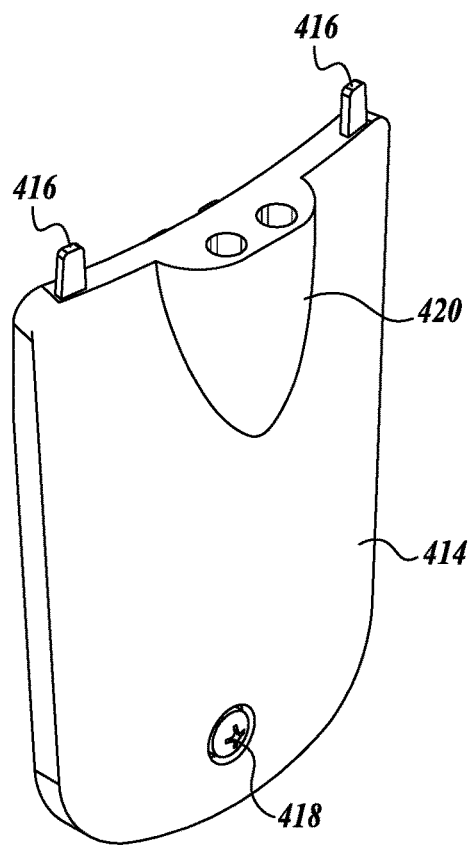
FIGS. 4B and 4C depict two perspective views of a replacement battery compartment cover that can be used with the testing device to allow the testing device to be powered by a current clamp.
Figure 4C:
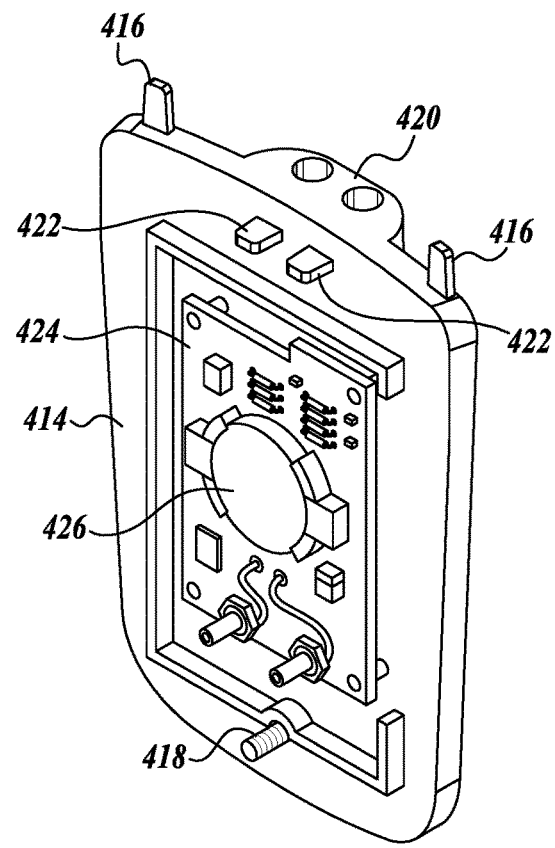

FIGS. 4B and 4C depict two perspective views of a replacement battery compartment cover 414 that can be used with the testing device 400 to replace the original battery compartment cover 406 to allow the testing device 400 to be powered by a current clamp. The battery compartment cover 414 includes connecting features that allow the battery compartment cover 414 to be secured to the battery compartment 402, including tabs 416 that can be inserted into slots (not shown) in battery compartment 402 and a screw 418 that can be secured into threaded hole 412. In other embodiments, the battery compartment cover 414 can have different connecting features, depending on the type of connecting features that the battery compartment 402 is designed to accept.

The battery compartment cover 414 also includes a connector 420. A current clamp can be coupled to the connector 420. The battery compartment cover 414 includes tabs 422 that contact terminals of the one or more batteries 404 in the battery compartment when the battery compartment cover 414 is secured to the battery compartment 402. When the connector 420 is coupled to a current clamp and the battery compartment cover 414 is secured to the battery compartment 402, electric current from the current clamp can be passed to the testing device 400 via the connector 420 and the tabs 422 to power the testing device 400. As described above, circuitry may convert the electric current induced by the current clamp into a direct current such that the testing device 400 is powered by the direct current. A portion or all of that circuitry may be provided in the battery compartment cover 414, such as in the connector 420. In the particular embodiment shown in FIG. 4C, the inside of the battery compartment cover 414 includes a printed circuit board 424 with a battery 426. The printed circuit board 424 can include a portion or all of the circuitry between a current clamp and the testing device 400. The battery 426 can replace the function of the original batteries 404 that were used with the testing device 400. Without the original batteries 404, the battery compartment 402 can provide sufficient room for the printed circuit board 424 and the battery 426 to be housed in the battery compartment 402 when the battery compartment cover 414 is secured to the battery compartment 402. In at least one embodiment, the battery 426 is a rechargeable battery. For example, the battery 426 can have improved recharge capabilities over the original batteries 404.

Although the battery compartment cover 414 may allow the testing device 400 to be powered by electric current provided by a current clamp, it may be advantageous to still provide the one or more batteries 404 in the battery compartment 402 as a supplemental power source. For example, the testing device 400 may draw a lower amount of current when receiving signals and measuring data (e.g., 4 mA) than it does when transmitting measured data (e.g., 60 mA). In some embodiments, the testing device 400 may continuously receive signals and measure data while powering a transmitter to send data only on a periodic basis. For example, the testing device 400 may power the transmitter to transmit data every 5 seconds for a duration of up to 300 milliseconds. During peak current draw times, the current clamp may not provide sufficient current to the testing device 400. Having the one or more batteries 404 in the battery compartment 402 as a supplemental power source will ensure that the testing device 400 will be able to draw sufficient current even at peak draw times. In at least one embodiment, the one or more batteries 404 are rechargeable batteries that can be charged by current provided by the current clamp. The one or more batteries 404 can be recharged by any current from the current clamp that is not drawn by the testing device 400 and the testing device 400 can draw current from the one or more batteries 404 when the current from the current clamp is insufficient to satisfy the needs of the testing device 400.

For users that own a testing device 400 with an original battery compartment cover 406, the ability to purchase a replacement battery compartment cover 414 that connects to a current clamp may allow the users to connect the testing device 400 to a current clamp without needing to replace the entire testing device 400. Thus, users upgrading existing testing devices 400 can save money by purchasing a replacement battery compartment cover 414 instead of purchasing a new testing device 400. However, in other embodiments, testing devices may be manufactured in a way that they are ready to receive power from a current clamp, such as having current clamp connectors integrated into a housing of the testing device and connected to circuitry inside the housing of the testing device.

Figure 5:
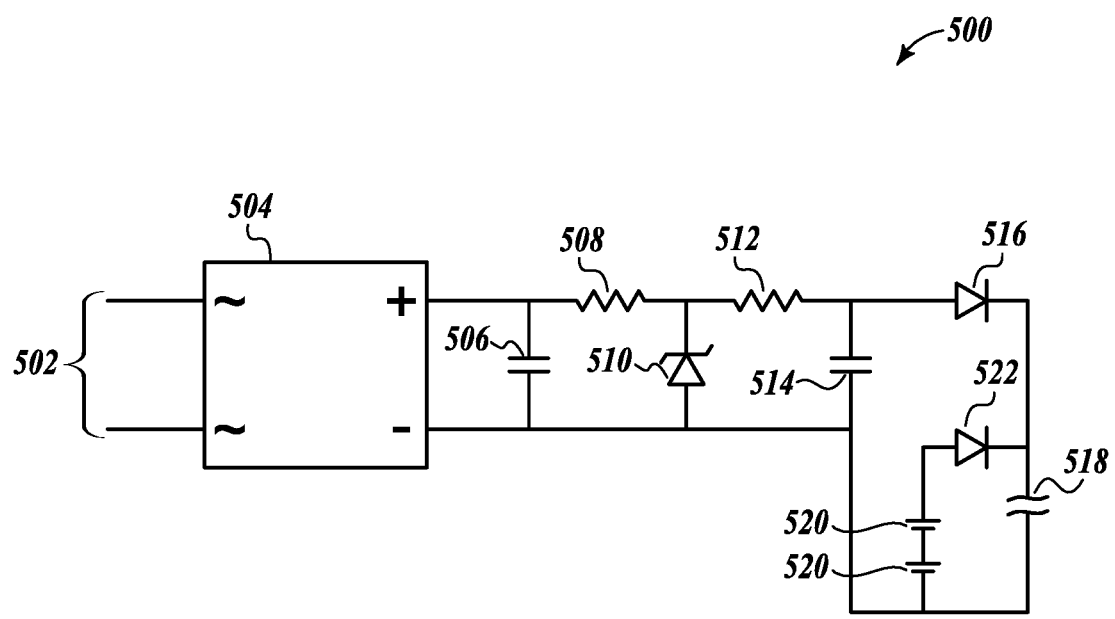
FIG. 5 depicts an example of circuitry that can convert current induced by a current transformer of a current clamp into direct current to power a testing device.

FIG. 5 depicts an example of circuitry 500 that can convert current induced by a current transformer of a current clamp into direct current to power a testing device. Induced alternating current received at inputs 502 are provided to a rectifier 504 that rectifies the alternating current. The circuitry 500 includes a first capacitor 506 and a first resistor 508 configured to provide smoothing of the rectified signal from the rectifier 504. The circuitry 500 also includes a Zener diode 510 that clamps voltage exceeding a particular level. The Zener diode 510 ensures that the testing device does not receive electrical energy at a voltage that exceeds the particular level. The circuitry 500 also includes a second capacitor 514 and a second resistor 512 configured to smooth the clamped voltage signal that passes the Zener diode 510.

The circuitry 500 includes a first diode 516 that permits passage of the smoothed current from the second capacitor 514 and the second resistor 512 to the testing device power inlet 518. The circuitry 500 also includes one or more batteries 520, which may be one or more batteries located inside of a battery compartment of the testing device. The circuitry 500 also includes a second diode 522 that permits passage of current from the one or more batteries 520 to the testing device power inlet 518. The combined operation of the first and second diodes 516 and 522 causes current to be selectively provided to the testing device power inlet 518 from either the converted current induced from the current clamp or the current available from the one or more batteries based on whether the voltage of the converted current induced from the current clamp is greater than or less than the current available from the one or more batteries.

In other embodiments not shown in FIG. 5, the converted current induced from the current clamp may be used for one or both of powering the testing device power inlet 518 or recharging the one or more batteries 520. For example, the circuitry 500 may include an integrated circuit configured to determine whether the converted current induced from the current clamp can be used to power the testing device power inlet 518 and/or recharging the one or more batteries 520. The integrated circuit may direct the entire converted current induced from the current clamp to power the testing device power inlet 518, direct the entire converted current induced from the current clamp to recharge the one or more batteries 520, and/or simultaneously direct one portion of the converted current induced from the current clamp to power the testing device power inlet 518 and another portion of the converted current induced from the current clamp to recharge the one or more batteries 520.

As discussed above, potions of the circuitry 500 depicted in FIG. 5 can be provided in one or more of a current clamp, wiring between the current clamp and the testing device, a connector or battery compartment cover of the testing device, or the testing device. The circuitry 500 depicted in FIG. 5 is one embodiment of circuitry that converts electric current induced by a current transformer of a current clamp into direct current to power a testing device. However, many other embodiments of circuitry may also be used to convert electric current induced by a current transformer of a current clamp into direct current to power a testing device.

In another embodiment, the circuitry 500 can be configured to sense the incoming induced alternating current from the current clamp. The circuitry 500 can be configured to determine whether the incoming current from the current clamp is at a level suitable to rectify to direct current. The circuitry may also include a transformer. In the event that the circuitry 500 determines that the incoming current from the current clamp is not at a level suitable to rectify to direct current, the circuitry 500 can use the transformer to adjust the incoming alternating current prior to providing the incoming alternating current to the rectifier 504. In this way, any number of current clamps can be coupled to the circuitry 500, and the circuitry 500 can adjust to different alternating currents from different current clamps.

Figure 6:
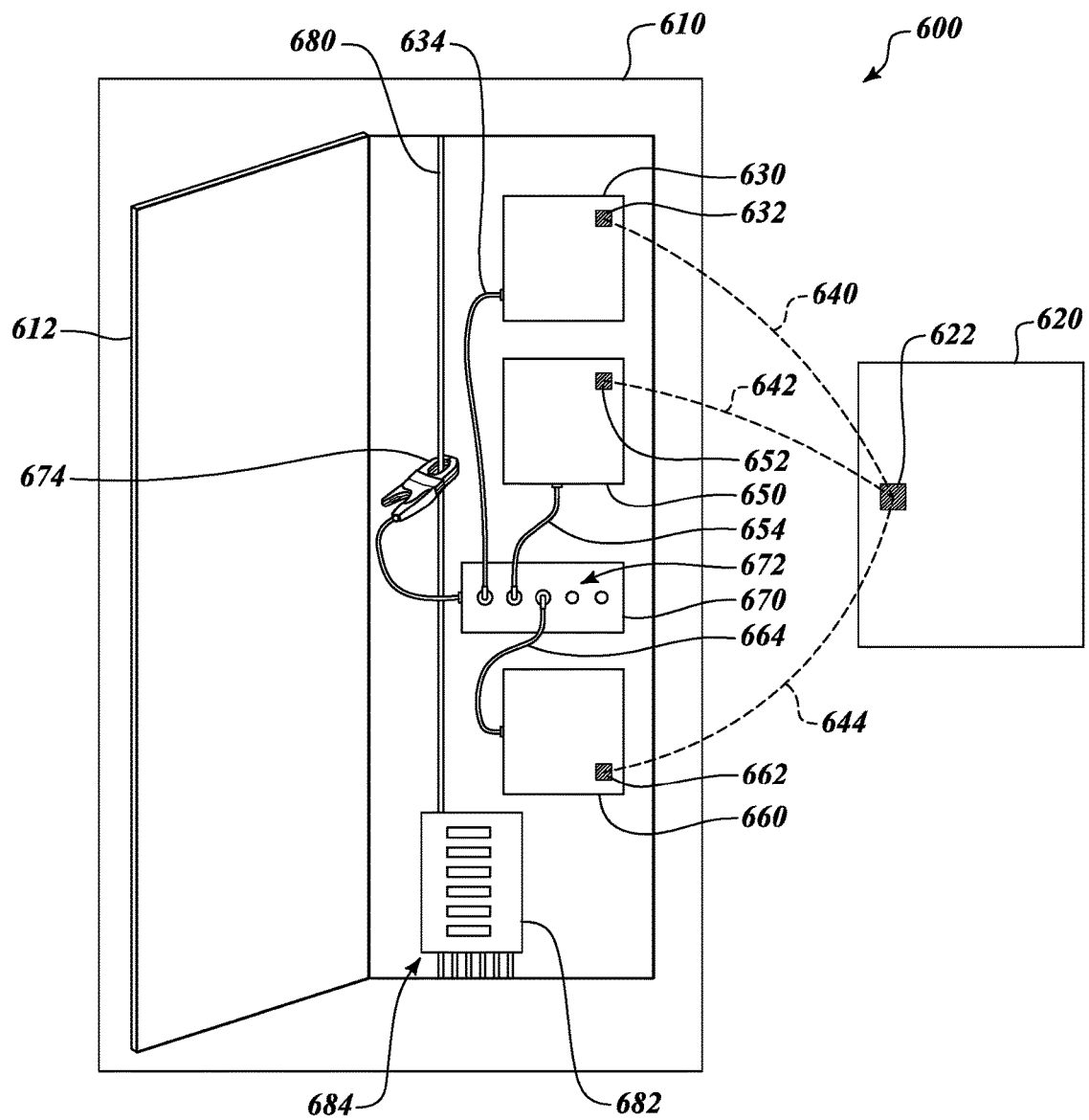
FIG. 6 depicts an example of another system with an electrical equipment area and a monitoring station.

FIG. 6 depicts another example of a system that includes an electrical equipment area and a monitoring station. As with the electrical equipment area 110 shown in FIG. 1B, the electrical equipment area 610 can be an enclosure, such as an electrical panel or a Faraday room or cage, a restricted area, such as a fenced-in electrical substation, or any other type of area that can contain or hold electrical equipment. The electrical equipment in the electrical equipment area 610 may include electrical components such as electrical wires or conductors, transformers, capacitors, circuit breakers, switches, voltage regulators, and the like, and/or non-electrical components that support electrical components, such as support structures, towers, fences, poles, conduits, and the like.

The monitoring station 620 may include a computing device, such as handheld mobile device, a computer, a server, and the like, to monitor and/or control the operation of multiple testing devices 630, 650, 660 positioned within the electrical equipment area 610. The monitoring station 620 may be located remotely from the electrical equipment area 610, e.g., at a sufficient distance from the electrical equipment area 610 such that a person can interact with the monitoring station 620 without needing to take special precautions from risks associated with the electrical equipment area 610.

In the example shown in FIG. 6, the electrical equipment area 610 includes a panel 612 that can be opened or removed to gain access to an interior of the electrical equipment area 610. The panel 612 may be configured to swing open as shown, or the panel 612 may be completely removed from the electrical equipment area 610 when servicing the area 610.

In FIG. 6, multiple testing devices 630, 650, 660 are positioned in the electrical equipment area 610. The testing devices 630, 650, 660 include circuitry that measures one or more characteristics relating to electrical equipment (e.g., voltage, current, magnetic fields, vibration, and the like) and/or environmental conditions in the electrical equipment area 610 (e.g., ambient temperature, pressure, relative humidity, temperature of components, and the like). The testing devices 630, 650, 660 directly measure the one or more characteristics using one or more sensors operating within the testing devices 630, 650, 660 or receive data relating to the characteristics from one or more sensors coupled (physically or communicatively) to the testing devices 630, 650, 660.

Some or all of the testing devices 630, 650, 660 are also capable of communicating information, including measured data, with the monitoring station 620 via wireless or wired transmission paths 640, 642, 644. In some embodiments, the testing devices 630, 650, and/or 660 may log measured data and periodically transmit the logged data as a batch to the monitoring station 620. In other embodiments, the testing devices 630, 650, and/or 660 may immediately transmit measured data to the monitoring station 620 without logging the data in the testing device. The testing device 630 includes a transceiver 632, while the testing device 650 includes a transceiver 652 and the testing device 660 includes a transceiver 622. The transceivers 632, 652, 662 communicate with a transceiver 622 operating in the monitoring station 620 via the transmission paths 640, 642, 644, respectively. Some or all of the transmission paths 640, 642, 644 may be wireless transmission paths, where the transceivers 622, 632, 652, 662 are wireless transceivers. In other cases, some or all of the transmission paths 640, 642, 644 may be configured for wired communication. The transmission paths 640, 642, 644 may also include a combination of both wired and wireless transmissions. The monitoring station 620 may further be configured to control the operation of one or more of the testing devices 630, 650, 660 by sending control signals containing instructions to the testing devices via the transmission paths 640, 642, 644. In circumstances where one-way communication is acceptable, simple transmitters or receivers may be used in place of the transceivers 622, 632, 652, and/or 662.

As with the testing device 130 shown in FIG. 1B, the testing devices 630, 650, 660 may be left operating in the electrical equipment area 610 for a period of time, including after the panel 612 is closed. Some operations of the testing devices 630, 650, 660 may require more power than other operations (e.g., the testing devices may use more power when sending or receiving transmissions than when measuring data). A continuous source of power for the testing devices 630, 650, 660 is desirable.

While FIGS. 1-5 describe systems in which individual testing devices 220 in an electrical equipment area 110 obtain continuous power using a current clamp 240 positioned around an electrical conductor 212, it is recognized that in cases where multiple testing devices are positioned within an electrical equipment area, it may be unwieldy or impossible (if there is insufficient space) for each testing device to separately position a current clamp around an electrical conductor. To address this need, a power distribution unit 670 may be positioned in the electrical equipment area 610, as shown in FIG. 6. The power distribution unit 670 provides multiple electrical outputs 672 to which multiple electrical devices, such as the testing devices 630, 650, 660, maybe coupled to obtain power. The power distribution unit 670 is configured to meet all operational constraints of the electrical equipment area 610, including constraints designed to meet safety standards for operating within the electrical equipment area. As will be described below, the power distribution unit 670 provides continuous power to the testing devices 630, 650, 660 within the electrical equipment area 610.

The power distribution unit 670 is electrically coupled to a current clamp 674. The electrical equipment area 610 includes multiple electrical conductors that carry electric current, including (in this example) an electrical conductor 680. In the configuration shown, the electrical conductor 680 is coupled to electrical equipment 682, to which multiple additional electrical conductors 684 are connected. The current clamp 674 is shown clamped around the electrical conductor 680. A varying electrical current in the electrical conductor 680 induces an electrical current in the current clamp 674, and the power distribution unit 670 uses this induced electrical current to provide a power source for the testing devices 630, 650, 660.

As with the current clamp 240 described earlier, the current clamp 672 includes a handle and activation component, and when clamped around the electrical conductor 680, the current clamp 672 forms a non-toroidal current transformer. The jaws of the current clamp 672 are biased to a closed position, but can be opened to allow a user to place the current clamp 672 around the electrical conductor 680, after which the current clamp 672 returns to a closed position. This ability to quickly and easily clamp the current clamp 672 around the electrical conductor 680 (or any other conductor) reduces the amount of time required to install the power distribution unit 670 in the electrical equipment area 610 and likewise remove the power distribution unit 670 from the electrical equipment area.

The electric current carried by the electrical conductor 680 is typically significantly higher than the current needed by the power distribution unit 670 to provide power to the testing devices. For example, as with the current clamp 240 described earlier, the electric current induced by the current clamp 672 may be equal to or less than about 1% of the electric current carried by the electrical conductor 680. In some cases, the induced electric current may indeed be less, such as equal to or less than about 0.2% of the electric current carried by the electrical conductor 680. The jaw size of the current clamp 672 and/or the step down of the current transformer formed by the current clamp 672 can be selected based on one or more of a size of the electrical conductor 680, the electric current carried by the electrical conductor 680, the space available in the electrical equipment area 610, and/or the current needed to power the testing devices 630, 650, 660.

Figure 8:
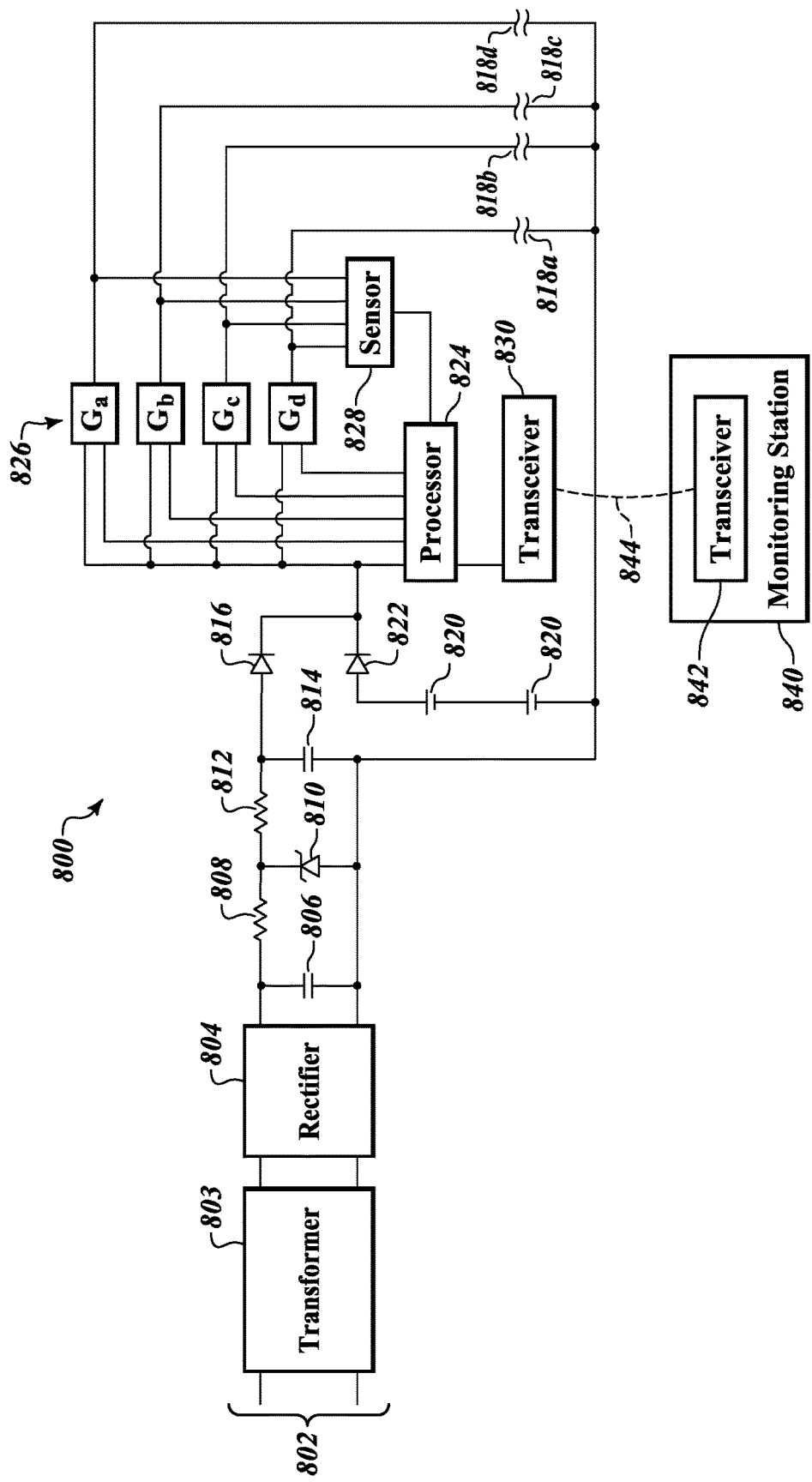
FIG. 8 depicts an example of circuitry that can convert current induced by a current transformer of a current clamp into direct current to power multiple testing devices.

Conversion circuitry may be located in the current clamp 672, in the power distribution unit 670, along the wiring coupling the current clamp 672 to the power distribution unit 670, or any combination thereof, and used to electrically convert the induced electric current from an alternating current to a direct current that powers the testing devices 640, 650, 660, or any other electrical device coupled to the power distribution unit 670. FIG. 8 depicts an example of such conversion circuitry along with distribution circuitry that distributes the converted electrical current to multiple electrical outputs.

Figure 7:
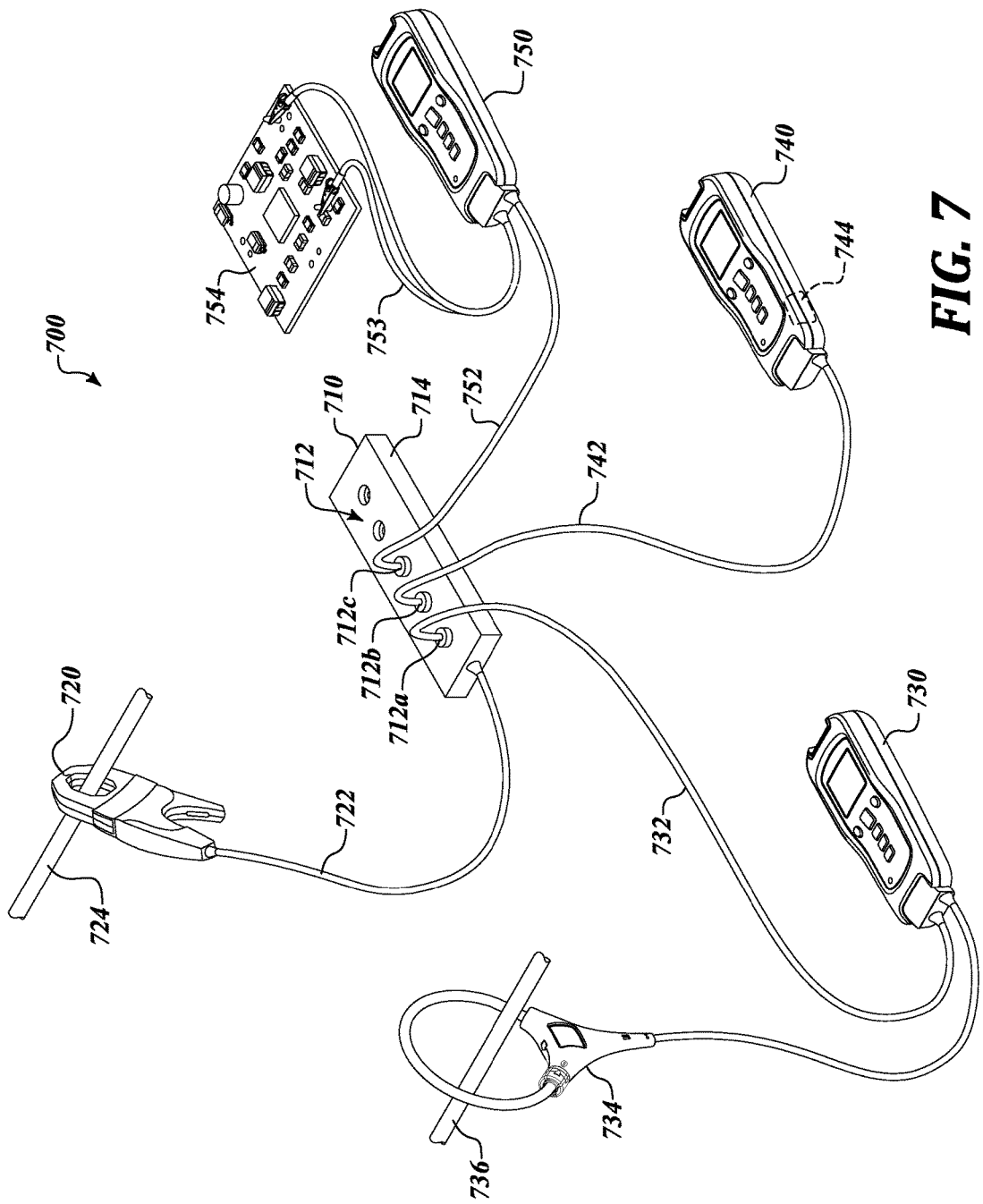
FIG. 7 depicts an example of a system that provides continuous power to multiple testing devices within an electrical equipment area.

FIG. 7 is a pictorial diagram illustrating an example of a system 700 that provides continuous power to multiple testing devices within an electrical equipment area. The system 700 includes a power distribution unit 710 having a housing 714 and multiple electrical outputs 712. The power distribution unit 710 is electrically coupled by a wire 722 to a current clamp 720 that, as illustrated, is clamped around an electrical conductor 724. As with the current clamp 672 shown in FIG. 6, the current clamp 720 outputs an induced current via the wire 722 to the power distribution unit 710 when a varying electrical current is flowing through the electrical connector 724. While the power distribution unit 610 in FIG. 6 and the power distribution unit 710 in FIG. 7 are shown providing five electrical outputs, the power distribution units 610, 710 may include any number of electrical outputs.

A first testing device 730 is coupled by a wire 732 to a first electrical output 712a of the power distribution unit 710, while a second testing device 740 is coupled by a wire 742 to a second electrical output 712b and a third testing device 750 is coupled by a wire 752 to a third electrical output 712c of the power distribution unit 710. As with the testing device 220 described earlier, the testing devices 730, 740, 750 may include a display and one or more user interface mechanisms. The testing devices 730, 740, 750 may also include indicators (e.g., LEDs) that provide an indication whether the respective testing device is receiving power from the power distribution unit 710. In other embodiments, an indicator such as an LED may be provided on the handle of the current clamp 720 or on the power distribution unit 710 to indicate when current is being provided from the current clamp 720 to the multiple outputs of the power distribution unit 710. In yet other embodiments, an indicator such as an icon may be provided on the display of the testing devices 730, 740, 750, when the respective testing device is receiving power from the power distribution unit 710.

The testing device 730 is shown coupled to a sensor 734 that produces a signal indicative of a characteristic of electrical equipment, such as an electrical conductor 736. In the example depicted in FIG. 7, the sensor 734 is a Rogowski coil positioned around the electrical conductor 736. The signal is provided to the testing device 730 where the testing device 730 measures data about the characteristic based on the signal. A Rogowski coil measures electrical characteristics such as alternating current and/or high speed current pulses in the electrical conductor 736.

The testing device 740 is shown having a sensor 744 that is internal to the testing device 740. The sensor 744 provides a signal to circuitry in the testing device 740 based on a sensed characteristic. The sensor 744 may be, for example, a pressure sensor (e.g., a piezoelectric sensor), a temperature sensor (e.g., a thermocouple), a humidity sensor (e.g., an electric hygrometer), or any other type of sensor. The testing device 740 measures data relating to the characteristic based on the signal received from the sensor 744.

The testing device 750 includes leads 753 that are coupled to electrical equipment 754, which can be any type of equipment such as a printed circuit board, a battery, a capacitor, a transformer, a motor, or any other type of equipment in the electrical equipment area. The testing device 750 measures data relating to a characteristic of the equipment 754, such as for example, a voltage difference across the leads 753 or a resistance between the leads 753.

Some or all of the testing devices 730, 740, 750 may include communication circuitry (e.g., a transceiver that may be coupled to a processor) that is configured to transmit measured data to a remote computing device (e.g., the monitoring station 620 shown in FIG. 6). While the testing devices 730, 740, 750 include features such as a display and a user interface, some or all of the testing devices may instead be configured similar to the testing device 320 shown in FIG. 3 which does not include a display and/or user interface. The cost of a testing device without a display or user interface may be lower than the testing devices shown in FIG. 7, and may be acceptable for use in circumstances where the testing device is placed in an electrical equipment area and left unattended for long periods of time to measure and transmit data.

FIG. 8 depicts an example of circuitry 800 that converts alternating current into direct current and distributes the converted current to multiple electrical outputs. The alternating current is received at inputs 802 and, in this embodiment, provided to a transformer 803 that electrically isolates the remaining circuitry from the inputs 802. Electrical isolation is valuable when the incoming alternating current is susceptible to spikes or other electrical anomalies that could harm the remaining circuitry or electrical devices coupled to the remaining circuitry. The transformer 803 may also be used to electrically convert incoming electrical current at a first voltage to a converted current having a second voltage that is higher or lower than the first voltage. In circumstances where the incoming alternating current is induced by a current clamp, such as the current clamp 720 shown in FIG. 7, the current clamp forms a transformer and provides electrically isolated induced current. In such circumstances, if the voltage level of the induced current is at a desirable level, the transformer 803 may not be needed. The electrical current from the transformer 803 (or induced electrical current from the current clamp, as the case may be) is provided to a rectifier 804 that rectifies the alternating current. Circuitry for rectifying alternating current is known in the art.

A first capacitor 806 and a first resistor 808 coupled to the output of the rectifier 804 smooth the voltage of the rectified current. A Zener diode 810 coupled across the capacitor 806 and resistor 808 clamps the voltage of the rectified current and helps ensure that the voltage of the electrical signal distributed to electrical outputs 818a-818d does not exceed a particular voltage level. A second capacitor 814 and a second resistor 812 coupled across the Zener diode 810 further smooth the clamped voltage signal that passes the Zener diode 810.

A first diode 816 permits the smoothed current from the second capacitor 814 and the second resistor 812 to flow to distribution circuitry that distributes the current to electrical outputs 818a-818d. In parallel, a second diode 822 permits current from one or more batteries 820 to flow to the distribution circuitry. The combined operation of the first and second diodes 816 and 822 causes current to be selectively provided to the distribution circuitry from either the converted current received from the transformer 803 (or induced from a current clamp) or the current available from the one or more batteries 820, based on whether the voltage of the converted current is greater or less than the voltage of the current available from the one or more batteries 820.

The converted current may also be used for one or both of providing power to the outputs 818a-818d or recharging the one or more batteries 820. For example, circuitry (not shown) may direct the entire converted current to provide power to the outputs 818a-818d, direct the entire converted current to recharge the one or more batteries 820, and/or simultaneously direct a portion of the converted current to the outputs 818a-818d and a portion of the converted current to recharge the one or more batteries 820. The circuitry may be embodied, for example, in an integrated circuit with sensors that sense available voltage or current from the batteries 820, the available converted current passing the diode 816, and the power demands of electrical devices coupled to the outputs 818a-818d. If the available converted current exceeds the power demands of the coupled electrical devices, the integrated circuit may divert the excess converted current to recharge the batteries 820.

Portions of the circuitry 800 can be provided in one or more of a current clamp, the power distribution unit, or wiring between the current clamp and the power distribution unit. The circuitry 800 shown in FIG. 8 is only one embodiment of circuitry that converts electric current, e.g., induced by a current clamp, into direct current to provide a power source for multiple electrical outputs. The circuitry 800 may be configured differently and still used to convert electric current induced by a current clamp into direct current for distribution to multiple electrical outputs.

The circuitry 800 includes distribution circuitry that distributes the converted current to the multiple electrical outputs 818a-818d. The electrical outputs 818a-818d are each couplable to an electrical device, such as a testing device, to provide power to the electrical device. In some embodiments, the distribution circuitry distributes the converted current equally to the electrical outputs 818a-818d. In other embodiments, the distribution circuitry selectively distributes different amounts of the converted current to different electrical outputs of the multiple electrical outputs 818a-818d.

To control the flow of current to the electrical outputs 818a-818d, the distribution circuitry includes one or more gating elements 826. A first set of gating elements Ga is coupled between the output of diodes 816, 822 and the first electrical output 818a, and control the amount of current flowing to the electrical output 818a. Similarly, second, third, and fourth sets of gating elements Gb, Gc, and Gd are respectively coupled between the output of the diodes 816, 822 and the second, third, and fourth electrical outputs 818b, 818c, 818d, and control the amount of current flowing to the electrical outputs 818b, 818c, and 818d. The gating elements 826 may comprise one or more transistors or logic gates that are controllable, in this example, by a processor 824. For gating elements comprised of individual transistors, the processor 824 may output voltage signals of predetermined levels that cause the transistors to allow current to flow, partially or fully, or not flow, through the transistors to the electrical outputs 818. For gating elements comprised of higher-level logic gates, the processor 624 may output voltage signals that cause the logic gates to allow current to flow, partially or fully, or not flow, through the logic gates.

In FIG. 8, the distribution circuitry further includes a sensor 828 that is operable to sense an amount of current flowing to the multiple electrical outputs 818a-818d. One or more of the gating elements 826 may be configured to control the amount of converted current that flows to one or more of the electrical outputs 818a-818d based on the sensed amount of current, which reflects a power demand of an electrical device coupled to the respective electrical output. In the embodiment shown in FIG. 8, the sensor 828 outputs a signal indicative of the measured current to the processor 824. In response, the processor 824 outputs voltage signals to the one or more gating elements 826 to control the amount of converted current that flows through the gating elements 826 to the respective electrical outputs 818a-818d.

In some embodiments, the gating elements 826 selectively control the amount of converted current that flows to an electrical output based on a priority assigned to the electrical output. For example, the electrical outputs 818a-818d may be visually marked with reference numerals, such as "1" to "4", wherein the electrical output marked "1" may be assigned a highest priority to draw current from the converted electrical current, while the electrical output marked "2" may be assigned a second highest priority to draw current from the converted electrical current, and so forth. The assigned priorities may be enforced by programming of the processor 824 or in logic circuitry of the gating elements 826 that controls the amount of converted current flowing through the gating elements Ga-Gd to the respective electrical outputs 818a-818d.

Alternatively or in addition, the gating elements 826 may selectively control the amount of converted current that flows to an electrical output based on a location of the electrical output relative to other electrical outputs. For example, with the power distribution units 670, 710 in FIGS. 6 and 7, the electrical outputs 672, 712 are arranged in a row. The electrical output closest to the wire that couples the power distribution unit 670, 710 to the current clamp 674, 720, may have a highest priority to draw from the converted electrical current, while the electrical output located next to it may be assigned a second highest priority to draw from the converted electrical current, and so forth. Users of the power distribution units 670, 710 may thus selectively plug electrical devices into the electrical outputs 672, 712 according to the location of the electrical outputs. If there is insufficient incoming electrical current to power all of the electrical devices coupled to the outputs 672, 712, the locations of the electrical outputs reflect priorities that ensure sufficient electrical current is provided to the electrical devices in an order of importance.

In some embodiments, the gating elements 826 may selectively control the amount of converted current that flows to different electrical outputs 818a-818d during different time periods. For example, during multiple time periods, different priorities may be assigned and enforced for the different electrical outputs. Alternatively, during different time periods (overlapping or non-overlapping), some of the gating elements may allow current to flow, possibly in different amounts, while other gating elements do not allow current to flow. In this regard, the processor 824 may be used to control the gating elements. The flow of converted current to the electrical outputs 818a-818d may thus be controlled with a form of time division multiplexing. The different time periods may be equal in length, or may be different in length. Variable length time periods may be used based on assigned priorities and/or the types of electrical devices plugged into the electrical outputs 818a-818d.

In some embodiments, it may be advantageous (and possibly necessary for compliance with safety standards) for each of the electrical outputs 818a-818d to be electrically isolated from each other. As mentioned earlier, electrical isolation of circuitry may be achieved using a transformer. To electrically isolate the electrical outputs 818a-818d from each other, the circuitry 800 may be further configured to include a transformer in series with each of the outputs 818a-818d. For example, the converted current flowing through each of the gating elements 826 may be directed through a respective transformer before the converted current is delivered to the electrical outputs 818a-818d. In some embodiments, the electrical devices coupled to the electrical outputs 818a-818d may include a transformer that isolates the respective electrical device from the electrical output to which it is coupled. Such isolation may provide protection against excessive current inadvertently being backfed from the electrical device into the circuitry 800.

The circuitry 800 may further include communication circuitry 830, such as a receiver, transmitter, or transceiver, that communicates with at least one electrical device coupled to at least one electrical output of the multiple electrical outputs 818a-818d. The transceiver 830 may receive data, such as one or more measured electrical characteristics, from the at least one electrical device. With an appropriate communication protocol, the transceiver 830 may communicate simultaneously with multiple electrical devices coupled to the multiple electrical outputs 818a-818d.

In some embodiments, the communication circuitry 830 may receive data from one or more electrical devices via wireless communication. In such embodiments, the electrical devices (such as the testing devices 630, 650, 660 shown in FIG. 6) have communication circuitry (e.g., transceivers 632, 652, 662) that communicate through radio transmission with the communication circuitry 830 shown in FIG. 8. The communication circuitry 830 may further be capable of communicating information, including measured data received from the electrical devices, to a remote computing device such as the monitoring station 840 via a wireless or wired transmission path 844. Alternatively or in addition, the communication circuitry 830 is capable of receiving information, including instructions, from the monitoring station 840 that enable the monitoring station to control the operation of the circuitry 800 and/or the electrical devices coupled to outputs 818a-818d. The communication circuitry 830 may receive instructions from the monitoring station 840, and based on the received instructions, the processor 824 may operate the gating elements 826 to control the amount of current that flows to one or more of the multiple electrical outputs 818a-818d.

In some embodiments, the communication circuitry 830 may receive data or other information from one or more electrical devices via wired communication. For example, electrical devices coupled to one or more of the electrical outputs 818a-818d may communicate with the communication circuitry 830 via the respective electrical outputs to which the electrical devices are coupled. The electrical devices may use various wireline communication protocols to superpose a communication signal on the wires that otherwise supply current from the gating elements 826 to the electrical outputs 818a-818d. If some cases, the sensor 828 may include circuitry that senses and decodes the communication signals on the wire connections and provides the decoded communication signals to the processor 824. The communication circuitry 830 may thereafter communicate the data and information received from the electrical devices to the monitoring station 840. The communication circuitry 830 may also be configured to communicate with a remote computing device, such as the monitoring station 840, to transmit information pertaining to operation of the system, including the circuitry 800.

The systems provided by the present disclosure may thus provide a power source with multiple electrical outputs within an electrical equipment area such as the area 610 shown in FIG. 6. In various embodiments, the systems include a current transformer that is selectively positionable with respect to an electrical conductor of multiple electrical conductors in the electrical equipment area (e.g., the electrical conductor 680) such that a varying current flowing through the electrical conductor induces a current in the current transformer. Conversion circuitry that is electrically coupled to the current transformer electrically converts the current induced in the current transformer to a converted current that is usable to power multiple electrical devices. Distribution circuitry coupled to the conversion circuitry distributes the converted current to the multiple electrical outputs, wherein each electrical output is couplable to an electrical device to provide power to the electrical device. In various embodiments, at least the conversion circuitry, the distribution circuitry, and the multiple electrical outputs are contained within a housing (e.g., the housing 714 shown in FIG. 7) that remains in the electrical equipment area when the current transformer is positioned with respect to the electrical conductor and the converted current is being distributed to the multiple electrical outputs. As described herein, the current transformer may be a current clamp (e.g., the current clamp 720 in FIG. 7) that is clampable around an electrical conductor in the electrical equipment area.

While the present application has been illustrated and described in detail in the drawings and foregoing description, such illustration and description are to be considered illustrative or exemplary and not restrictive. The present disclosure is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

The invention claimed is:

1. A system providing a power source, comprising:
   a current clamp that forms a current transformer, wherein the current clamp is configured to be clamped around an electrical conductor and output an induced current when a varying current is flowing through the electrical conductor; and
   a power distribution unit electrically coupled to the current clamp, wherein the power distribution unit includes:
   multiple electrical outputs;
   conversion circuitry that electrically converts the induced current to a converted current that is usable to power multiple electrical devices; and
   distribution circuitry that distributes the converted current to the multiple electrical outputs, wherein each electrical output is couplable to an electrical device to provide power to the electrical device, and wherein the distribution circuitry includes one or more gating elements that control an amount of converted current that flows to one or more of the multiple electrical outputs.

2. The system of claim 1, wherein the induced current is an alternating current and the conversion circuitry electrically converts the induced current to a direct current.

3. The system of claim 1, wherein the current clamp outputs the induced current at a first voltage and the conversion circuitry electrically converts the induced current to a converted current having a second voltage lower than the first voltage.

4. The system of claim 1, wherein the distribution circuitry distributes the converted current equally to the multiple electrical outputs.

5. The system of claim 1, wherein the distribution circuitry selectively distributes different amounts of the converted current to different electrical outputs of the multiple electrical outputs.

6. The system of claim 1, wherein the distribution circuitry further includes a sensor operable to sense an amount of current flowing to the multiple electrical outputs, and wherein the one or more gating elements control the amount of converted current that flows to the one or more electrical outputs based on the sensed amount of current.

7. The system of claim 1, wherein the one or more gating elements selectively control the amount of converted current that flows to an electrical output based on a priority assigned to the electrical output.

8. The system of claim 1, wherein the one or more gating elements selectively control the amount of converted current that flows to an electrical output based on a location of the electrical output relative to other electrical outputs.

9. The system of claim 1, wherein the one or more gating elements selectively control the amount of converted current that flows to different electrical outputs during different time periods.

10. A system providing a power source, comprising:
    an electrical input and multiple electrical outputs, wherein the electrical input is couplable to a current clamp that selectively clamps around at least one electrical conductor;
    a transformer coupled to the electrical input, wherein the transformer produces an output electrical signal that is electrically isolated from current flowing in the at least one electrical conductor;
    conversion circuitry that electrically converts the output electrical signal to a converted electrical signal that is usable to power multiple electrical devices; and
    distribution circuitry that distributes the converted electrical signal to the multiple electrical outputs, wherein each electrical output is couplable to an electrical device to provide power to the electrical device, and wherein the distribution circuitry includes one or more gating elements that control an amount of the converted electrical signal that is distributed to one or more of the multiple electrical outputs.

11. The system of claim 10, wherein the current clamp forms the transformer and produces the output electrical signal by induction from an electrical signal flowing in the at least one electrical conductor.

12. The system of claim 10, wherein the distribution circuitry includes a sensor that senses an amount of current flowing to the multiple electrical outputs, the system further comprising control circuitry that controls an amount of current that flows to one or more of the multiple electrical outputs based on the sensed amount of current.

13. The system of claim 10, further comprising communication circuitry that communicates with at least one electrical device coupled to at least one electrical output of the multiple electrical outputs and receives data from the at least one electrical device.

14. The system of claim 13, wherein the communication circuitry receives data from the at least one electrical device via the at least one electrical output to which the electrical device is coupled.

15. The system of claim 13, wherein the communication circuitry further communicates with a remote computing device and transmits the received data to the remote computing device.

16. The system of claim 10, further comprising communication circuitry configured to communicate with a remote computing device and receive instructions from the remote computing device, wherein the one or more gating elements control an amount of current that flows to one or more of the multiple electrical outputs based on instructions received from the remote computing device.

17. The system of claim 10, further comprising communication circuitry configured to communicate with a remote computing device that is not coupled to any of the multiple electrical outputs and transmit information pertaining to operation of the system to the remote computing device.

18. A system providing a power source positionable within an area holding electrical equipment, the system comprising:
 a current transformer that is selectively positionable with respect to an electrical conductor of multiple electrical conductors that are located in the area with the electrical equipment such that a varying current flowing through the electrical conductor induces a current in the current transformer;
 conversion circuitry electrically coupled to the current transformer, wherein the conversion circuitry electrically converts the current induced in the current transformer to a converted current that is usable to power multiple electrical devices; and
 distribution circuitry that distributes the converted current to multiple electrical outputs of a power distribution unit, wherein each electrical output of the power distribution unit is couplable to an electrical device to provide power to the electrical device, and wherein the distribution circuitry includes one or more gating elements that control an amount of converted current that flows to one or more of the multiple electrical outputs,
 wherein at least the conversion circuitry, the distribution circuitry, and the multiple electrical outputs are contained within a housing of the power distribution unit, and
 wherein the power distribution unit remains in the area where the electrical equipment is located when the current transformer is positioned with respect to the electrical conductor and the converted current is being distributed to the multiple electrical outputs.

19. The system of claim 18, wherein the current transformer is a current clamp that is clampable around an electrical conductor in the area where the electrical equipment is located.

* * * * *